(12) United States Patent
Braun et al.

(10) Patent No.: US 7,646,650 B2
(45) Date of Patent: Jan. 12, 2010

(54) BUFFER COMPONENT FOR A MEMORY MODULE, AND A MEMORY MODULE AND A MEMORY SYSTEM HAVING SUCH BUFFER COMPONENT

(75) Inventors: Georg Braun, Holzkirchen (DE); Srdjan Djordjevic, Munich (DE); Andreas Jakobs, Munich (DE)

(73) Assignee: Infineon Technologies AG, Munich (DE)

( * ) Notice: Subject to any disclaimer, the term of this patent is extended or adjusted under 35 U.S.C. 154(b) by 719 days.

(21) Appl. No.: 11/368,267

(22) Filed: Mar. 3, 2006

(65) Prior Publication Data
US 2006/0227627 A1    Oct. 12, 2006

(30) Foreign Application Priority Data
Mar. 3, 2005    (DE)    ........................ 10 2005 009 806

(51) Int. Cl.
G11C 7/10    (2006.01)
(52) U.S. Cl. ................. 365/189.05; 365/51; 365/233.13
(58) Field of Classification Search ............ 365/189.05, 365/233.13, 233.18, 51, 233.1, 233.12; 711/105, 711/115, 154
See application file for complete search history.

(56) References Cited

U.S. PATENT DOCUMENTS

| | | | |
|---|---|---|---|
| 6,262,940 B1 | 7/2001 | Choi et al. | |
| 6,502,161 B1 * | 12/2002 | Perego et al. | 711/5 |
| 6,742,098 B1 * | 5/2004 | Halbert et al. | 711/172 |
| 6,922,764 B2 | 7/2005 | Dortu et al. | |
| 7,165,153 B2 * | 1/2007 | Vogt | 711/154 |
| 7,379,316 B2 * | 5/2008 | Rajan | 365/63 |
| 7,447,805 B2 * | 11/2008 | Braun et al. | 710/5 |
| 2004/0236877 A1 | 11/2004 | Burton | |
| 2005/0138267 A1 * | 6/2005 | Bains et al. | 711/100 |
| 2007/0079057 A1 * | 4/2007 | Ruckerbauer et al. | 711/105 |

FOREIGN PATENT DOCUMENTS

| | | |
|---|---|---|
| DE | 10065376 | 7/2002 |
| DE | 101 56 749 | 6/2003 |

* cited by examiner

*Primary Examiner*—Tuan T Nguyen
*Assistant Examiner*—Alexander Sofocleous
(74) *Attorney, Agent, or Firm*—Patterson & Sheridan, L.L.P.

(57) ABSTRACT

A buffer component for a memory module having a plurality of memory components includes item of access information in accordance with a data transmission protocol, the address, clock, control and command signals depending on the access information, a second data interface for driving a clock signal and address and command signals to the plurality of memory components and for driving a control signal to a group of the plurality of memory components in accordance with a signaling protocol, wherein an activation of the memory components and an acceptance of the address and command signals are effected in a manner dependent on the control signals, and a control unit which applies the address and command signals to the plurality of memory components during a first clock period of the clock signal and applies the control signal for activating the group of the plurality of memory components to the group of the plurality of memory components to be activated when address and command signals are present, in a succeeding second clock period of the clock signal, whereby the address and command signals present are accepted into the group of the plurality of memory components.

23 Claims, 4 Drawing Sheets

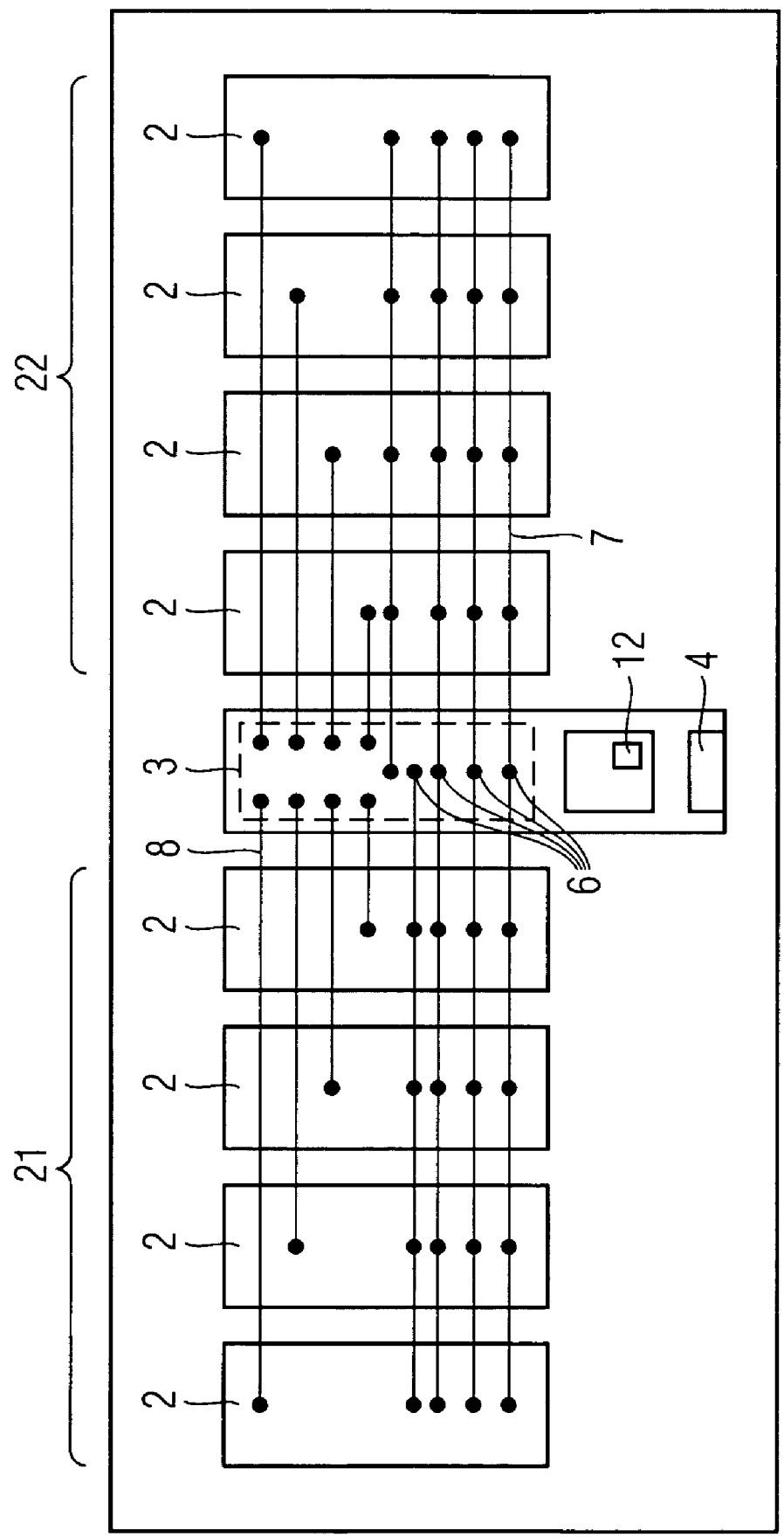

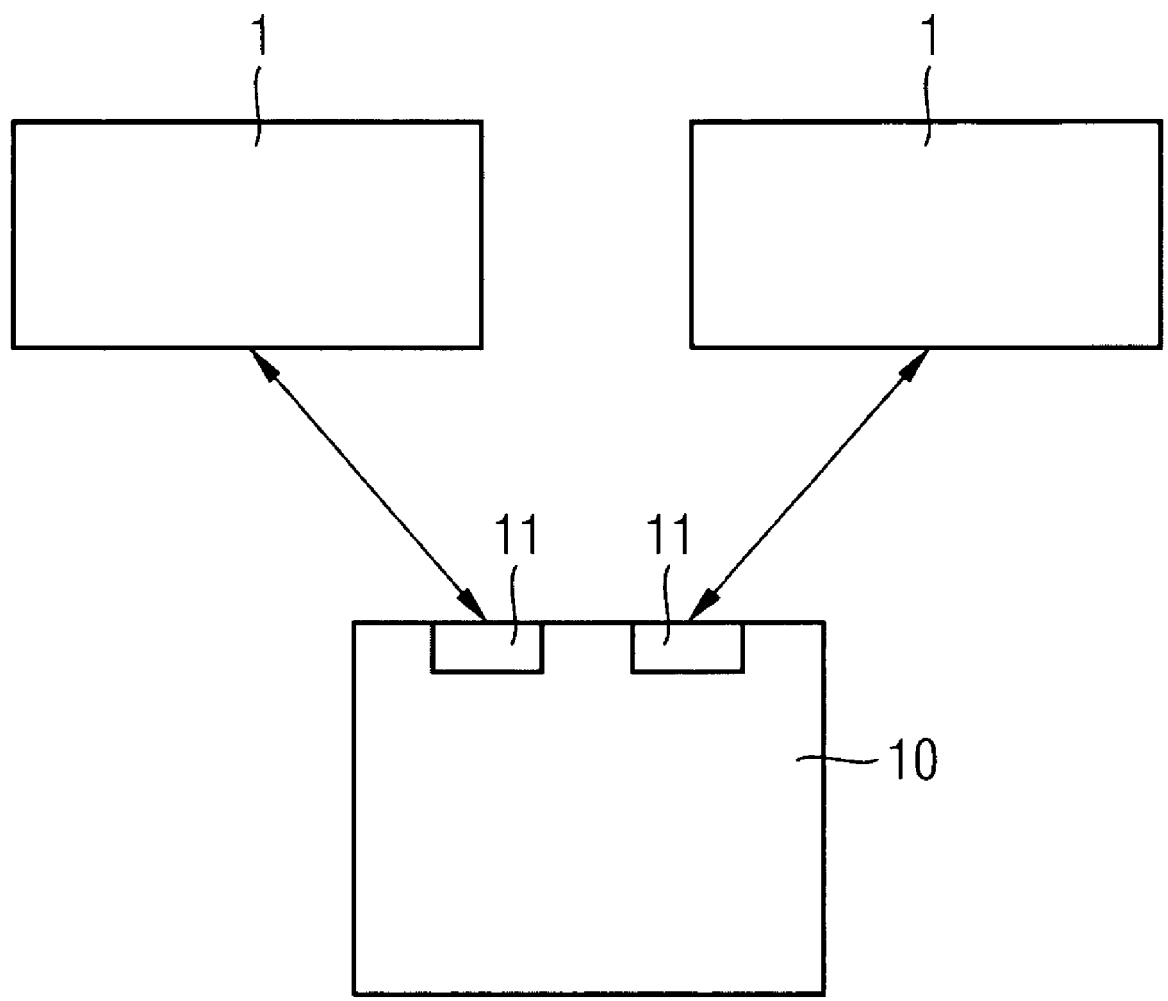

BUFFER COMPONENT FOR A MEMORY MODULE, AND A MEMORY MODULE AND A MEMORY SYSTEM HAVING SUCH BUFFER COMPONENT

CROSS-REFERENCE TO RELATED APPLICATIONS

This application claims foreign priority benefits under 35 U.S.C. §119 to co-pending German patent application number DE 10 2005 009 806.1, filed 3 Mar. 2005. This related patent application is herein incorporated by reference in its entirety.

BACKGROUND OF THE INVENTION

1. Field of the Invention

The invention relates to a buffer component for a memory module having a plurality of memory components. The invention further relates to a memory module having a plurality of memory components and a buffer component. Furthermore, the invention relates to a memory system having at least two memory modules and a memory controller that provides items of access information for the memory modules.

2. Description of the Related Art

In new types of memory modules, so-called "fully buffered dual in-line memory modules (DIMMs)", the memory components situated thereon are for example no longer directly connected to the memory controller of a computer system. Instead, a so-called buffer component is arranged between the memory controller and the memory components. The buffer component carries out the data transmission between the memory controller and the memory module with the aid of a transmission protocol in accordance with a high-speed transmission and applies the command, control, clock and address data contained therein for control purposes to the memory components. The transmission between the buffer component and the memory components is essentially effected with the aid of a so-called fly-by-bus, via which clock, command, address and control data can be applied to the memory components. The bus lines of a fly-by-bus are terminated with passive resistances at an end which is remote from the buffer component in order to suppress the reflection of electrical signals. In contrast thereto, the data signals for the transmission of control data are transmitted separately via separate lines between the buffer component and the individual memory components.

The fly-by-bus has a plurality of bus lines on which address signals, command signals and control signals are transmitted. The command and address signals are in each case connected to all the memory components on the memory module by corresponding signal lines. Depending on the construction of the memory modules, groups of memory components (also called "ranks") are respectively addressed by means of the control signals, so that, e.g., in dynamic random access memory (DRAM) circuits, the chip select signal CS can be activated respectively only for a group of memory components, and the memory components of this group receive and execute the command specified by the command signals, while the other memory components at which the command signals are present do not accept the command. As a result, a situation can occur in which the fly-by-bus has bus lines having different loads since the command and address signals are applied to all the memory components via the corresponding bus lines while the control signals are applied only in each case via the corresponding bus lines to a group of memory components which comprises a small number of memory components. Other effects may also lead to the loads on the bus lines being different.

The address, command and control signals provided by the buffer component propagate at different speeds on account of different loads on the respective bus lines and are therefore present at the memory components at different points in time. In particular, the control signals, which are usually provided for the acceptance of the address and command data in the respective memory component, are present at the respective memory component earlier than the address and command signals. The customary procedure for eliminating this problem by providing delay elements is therefore difficult because the different propagation times of the signals on the bus lines for the address and command signals and for the control signals are not known from the outset if the number of memory components used on a memory module is variable. As a result, the amount of the delay time between the presence of the control signals and the presence of the address and command signals cannot be predicted exactly.

Particularly in the case of memory modules having a plurality of groups of memory components, due to the high load on the bus lines for the address and command signals, these signals can no longer be transmitted at the full clock frequency since the signals are subjected to considerable interference on the path from the buffer component to the corresponding memory component.

SUMMARY OF THE INVENTION

One embodiment of the present invention provides a buffer component for a memory module in which the problem of the reliable acceptance of the command and address signals into the memory components on account of different signal propagation times on the bus lines is minimized or eliminated.

Another embodiment of the present invention provides a memory module having a plurality of memory components and a buffer component in which the problem of different signal propagation times on the bus lines of a common signal bus is reduced or eliminated.

A further embodiment of the present invention provides a memory system having a plurality of memory modules and a memory controller in which a reduction of the access speed to the memory modules on account of reduced access speed is avoided.

Yet another embodiment of the present invention provides a method for operating a buffer component which minimizes or eliminates the problem of the reliable acceptance of the command and address signals into the memory components on account of different signal propagation times on the signal lines.

A first aspect of the present invention provides a buffer component for a memory module having a plurality of memory components. The buffer component has a first data interface for receiving an item of access information in accordance with a data transmission protocol. The buffer component has a second data interface for driving a clock signal and address and command signals to the plurality of memory components and for driving a control signal to a group of memory components from the plurality of memory components in accordance with a signaling protocol. The group of memory components may comprise all or a portion of the plurality of memory components. The address, clock and command signals depend on the access information received via the first data interface. An activation of one of the memory components and an acceptance of the address and command signals are carried out when the control signal is present at the corresponding memory component. A control unit is further provided, which applies the address and command signals to the plurality of memory components during a first clock period of the clock signal and applies the control signal for activating the group of the plurality of memory components, to the group of memory components to be activated when address and command signals are present, in a succeeding second clock period of the clock signal, whereby the address and command signals present are accepted into the memory components of the group of the plurality of memory components.

What is thereby achieved first of all is that the memory module is operated with the aid of the buffer component only at half the data rate, that is to say effectively with the period duration doubled, since the control signal is applied to the group of the plurality of memory components only during the second clock period following the first clock period. As a result, address and command signals can be transmitted to the memory components at most only in every second clock period, so that the access speed is reduced. What is thereby achieved is that in particular when the corresponding address and command signals are applied onto a signal line with a large load, e.g., on account of a high number of connected memory components, the disturbance thereby effected in the input edge region of the corresponding signal is ignored since the control signal for the acceptance of the corresponding address and command data is not applied until during the second clock period.

In one embodiment, the control unit may be provided in such a way that, depending on a configuration value provided, it either applies the address and command signals to the plurality of memory components during the first clock period and applies the control signal for activating the group of the plurality of memory components to the group of the plurality of memory components when command and address signals are present in the succeeding second clock period, or applies the address and command signals to the memory components and the control signal to the group of the plurality of memory components to be activated during the same clock period. In this way, a memory module provided with such a buffer component can be configured in a manner dependent on the load on the signal lines, that is to say, e.g., in a manner dependent on the load on account of the quantity of memory components, so that it is possible to provide an operating mode with a low load on the signal lines (e.g., when there is a small quantity of connected memory components) and an operating mode for a large load on the signal lines (e.g., when there is a large quantity of memory components).

In accordance with a further embodiment of the invention, the buffer component has a configuration memory for storing the configuration value.

The control unit may furthermore be provided in such a way that the access information is converted into address, command and control signals for DRAM memory components in accordance with the signaling protocol.

A further aspect of the present invention provides a memory module having a plurality of memory components and a buffer component according to embodiments of the invention. The plurality of memory components are connected to the second data interface via first signal lines in such a way that each of the first signal lines is provided for transmitting the respective address and command signals from the buffer component to the plurality of memory components. A group of memory components, that is to say all or a portion of memory components from the plurality of memory components, is connected to the second data interface via a second signal line, so that the second signal line is provided for transmitting the control signal from the buffer component to the memory components of the group of memory components.

In contrast to conventional memory modules, the memory module according to one embodiment of the invention is operated with a buffer component which, with the aid of a data transmission protocol, receives items of access information which are converted into corresponding address, clock, control and command signals by the buffer component and provided to the plurality of memory components. For this purpose, the memory components are connected to the buffer component via corresponding signal lines which proceed from the buffer component and are connected to the group of memory components or to a portion or to all of the memory components. Such a bus system is also called a fly-by-bus.

The control unit of the buffer component may be configured in such a way that, depending on a configuration value provided, it either applies the address and command signals to the plurality of memory components during a first clock period and applies the control signal for activating the group of memory components (to the group of memory components when address and command signals are present) in a succeeding second clock period, or applies the address and command signals to the plurality of memory components and the control signal to the group of the plurality of memory components to be activated during the same clock period. In this way, the memory module can be operated in different operating modes depending on the load on the signal lines, and the configuration value is set depending on the construction of the memory module.

It may be provided that the configuration value can be stored in a configuration memory.

The memory components are provided so as to receive or transmit data signals in a burst mode, the length of the burst in which the data signals are transmitted in accordance with an activation by the corresponding control signal depending on the configuration value provided in the buffer component. In this way, it is possible to vary the length of the burst mode depending on the operating mode of the memory module, so that, in the case of an activation during a second clock period following a first clock period, the burst length is increased in order to be able to ensure the volume of data to be transmitted even in the case of operation of the memory module with a reduced data rate during which the control signals are not applied until during the second clock period.

A further aspect of the present invention provides a memory system comprising a plurality of memory modules and a memory controller connected to the plurality of memory modules. The memory controller provides the access information to each of the plurality of memory modules, so that the respective control signals generated from the access information for the plurality of memory modules are provided from the buffer components of the plurality of memory modules alternately to the respective memory components.

This memory system enables the access to the memory components which is slowed down by the activation of the respective memory component to be compensated for by memory components of a plurality of memory modules being addressed alternately. The compensation may be effected, for example, by virtue of the fact that the memory controller is provided in such a way that it transmits the respective access information alternately to the plurality of memory modules.

A further aspect of the present invention provides a method for operating a buffer component for a memory module having a plurality of memory components. In this case, an item of access information is received via a data transmission protocol and, in accordance with a signaling protocol, a clock signal, address and command signals are driven to the plurality of memory components and a control signal is driven to a group of memory components. The address, clock, control and command signals depend on the access information, an activation of the memory components and an acceptance of the address and command signals being effected when the control signals are present. The address and command signals are applied to the plurality of memory components during a first clock period and the control signal for activating the group of memory components being applied to the group of the plurality of memory components to be activated when address and command signals are present, in a succeeding second clock period, so that the address and command signals present are accepted into the group of the plurality of memory components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 shows a memory module in accordance with a further embodiment of the present invention, and FIG. 4 shows a memory system in accordance with a further aspect of the present invention.

DETAILED DESCRIPTION OF THE PREFERRED EMBODIMENT

Figure 1:
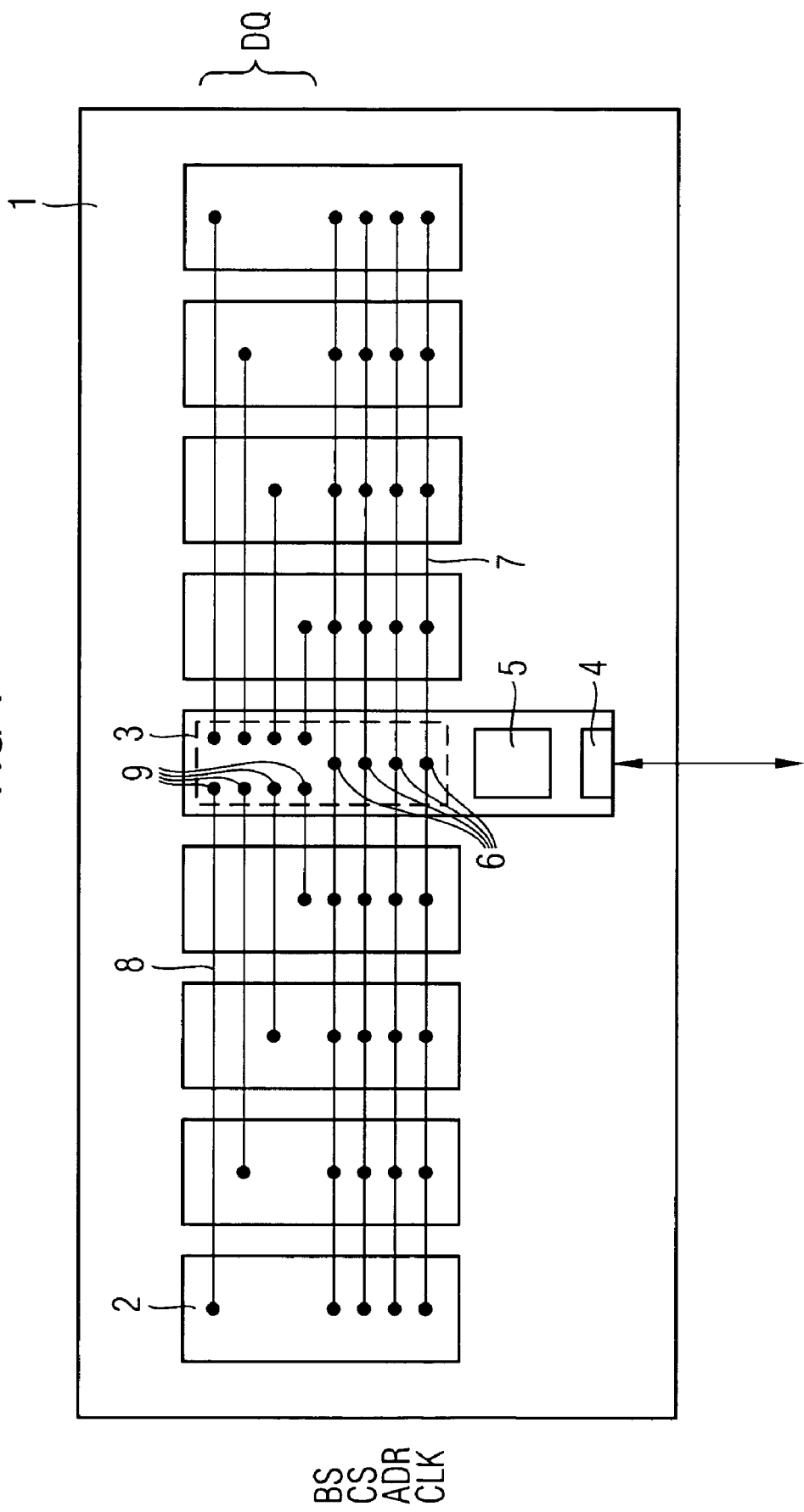
FIG. 1 shows a memory module in accordance with a first embodiment of the present invention.

FIG. 1 illustrates a block diagram of a memory module 1 according to one embodiment of the invention. The memory module 1 comprises eight memory components 2 connected to a buffer component 3. The memory module 1 is formed, for example, in the form of a printed circuit board on which are situated signal lines 7 to which the memory components 2 and the buffer component 3 are connected.

The buffer component 3 has a data transmission interface 4, via which the memory module 1 receives, from externally, an item of access information in order to write data, read out data or perform other functions in the memory components 2. The access information is provided to a control unit 5 for the buffer component 3, in which the access information is divided and/or converted into suitable address, clock, control and command signals for driving the memory components 2.

In the present exemplary embodiment, the memory components 2 are preferably DRAM memory components, but may also be other types of memory components, such as, for example, static random access memory (SRAM) components and the like.

The buffer component 3 further includes a signaling interface 6, which applies the clock, command and control signals taken or generated from the access information to the memory components 2 via the corresponding signal lines 7. For this purpose, each of the signal lines 7 of the memory module 1 is connected to a corresponding connection of the signaling interface 6 of the buffer component 3 and to a corresponding associated connection of each of the memory components 2. That is to say that if the buffer component 3 applies a corresponding signal to one of the signal lines 7, then this signal is made available to each of the memory components 2 via the associated signal line. This holds true for the control, command, clock and address signals in the exemplary embodiment illustrated. Memory data read out from the memory components 2 and memory data to be written to the memory components 2 are transmitted individually via data signal lines 8 from and to each of the memory components, that is to say that there is a so-called point-to-point connection between data connections 9 of the buffer component 3 and the respective data connections of the corresponding memory component 2.

In the case of DRAM memory components, the address signals comprise all address-related signals including the bank addresses, the control signals, the chip activation signal CS, the command signals, the row and column activation signals RAS, CAS, and also the write signal WE. These signals are taken from the access information received via the data transmission interface 4. In FIG. 1, the connecting lines illustrated are to be understood, depending on the embodiment, as one signal line or a bundle of a plurality of signal lines. By way of example, the address signals are transmitted via a plurality of signal lines from the buffer components 3 to the memory components 2, which is represented only by one connecting line for the sake of simplicity.

Figure 2:
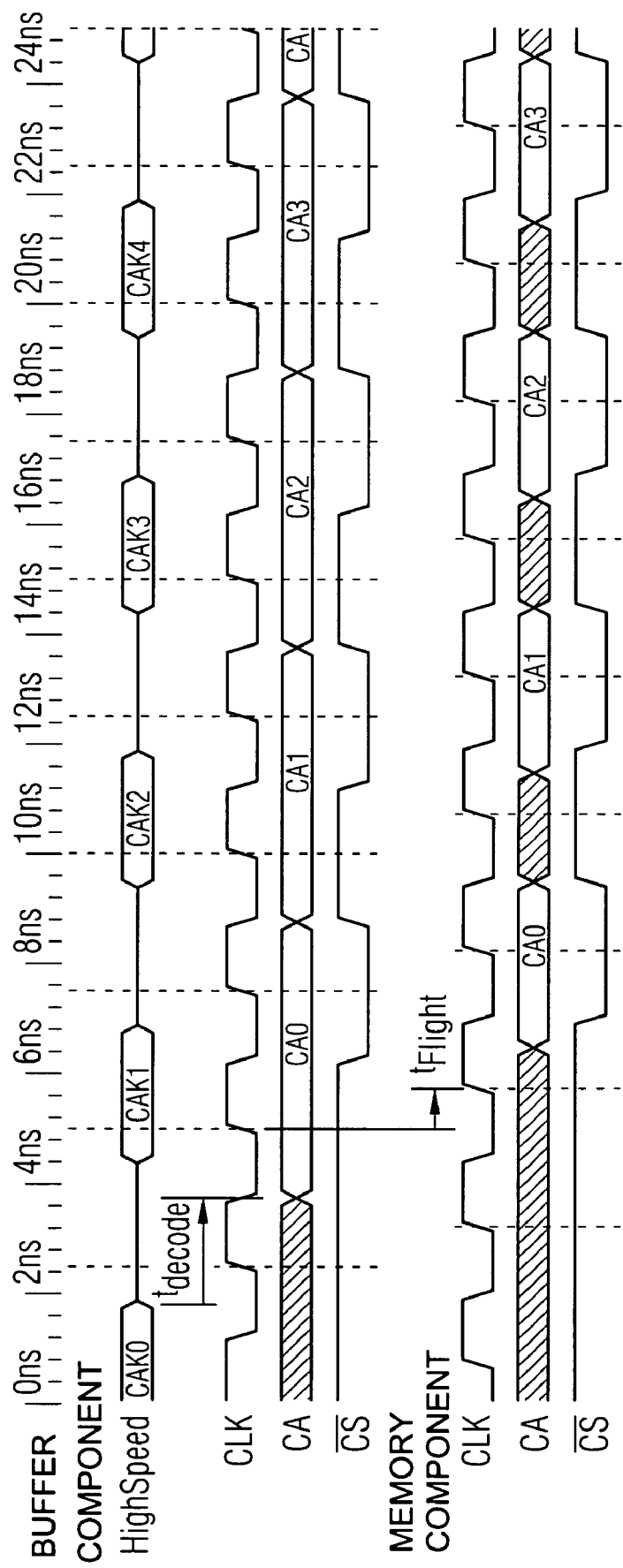
FIG. 2 shows a signal timing diagram for elucidating the functioning of the memory module according to the embodiment of FIG. 1.

The functioning of this memory module 1 is explained in more detail with the aid of the signal timing diagram of FIG. 2. The signal timing diagram shows the signal profiles of the clock signal CLK, the signal profiles of the address and command signals CA and also the signal profiles of a control signal CS (chip select or chip activation signal) both at the buffer component 3 and at the memory component 2. The address and command signals CA comprise the signals for communicating the address of the memory area to be addressed, the row and column activation signals RAS, CAS, and also the write signal WE, which specifies whether the memory area to be addressed is intended to be written to or read from.

What is evident first of all is the signal profile at the connections of the buffer component 3 and the signal profile—temporally offset in $t_{Flight}$—at the connections of one of the memory components 2. It is evident that in particular when there is a relatively large group of memory components 2 on the memory module 1, the time duration for which the command and address signals CA are present in valid fashion at the memory components 2 is significantly reduced relative to the time duration during which the command and address signals were applied by the buffer component 3. This is caused by the large load on the signal lines 7 for the command and address signals CA, which usually has the effect that the start of the signals, that is to say the time range near the input edge, is considerably disturbed, so that a reliable acceptance into the memory components while the respective signal is in the time range is not ensured. This effect occurs in particular at very high transmission frequencies, that is to say, high clock frequencies with which the memory module 1 is to be operated.

According to one embodiment of the invention, the memory module is operated in such a way that an access to a memory component 2 is effected during two clock periods of the clock signal CLK. Firstly, in a first clock period, the address and command signals are applied to the respective signal line by the buffer component 3. It is only after the end of the first clock period that, in a directly or not directly succeeding second clock period, the control signal, here the chip activation signal CS, is applied in such a way that the address and command signals CA present are thereupon read into the corresponding input buffers (not shown) of the addressed memory component/components 2. The chip activation signal is necessary in order that the address and command signals are accepted into the memory component. The address and command signals CA are applied during the first clock period, for example, at the beginning of the first clock period, in the example illustrated with a falling edge of the clock signal CLK. The chip activation signal CS is applied with the succeeding falling edge of the clock signal CLK. It is assumed in this case that after a clock period has elapsed, the signal disturbances which predominantly occur directly after a corresponding level change of the address and command signals can essentially no longer disturb the acceptance of the command and address signals CA into the memory components 2. In the case of higher clock frequencies and higher interference susceptibility of the command and address signals, it may also be provided that these signals are applied to the corresponding signal lines during a first clock period and the corresponding chip activation signal CS for the acceptance of the address and command signals CA is applied to the corresponding memory component 2 only during a third or later clock period.

Since an access to the corresponding memory component 2 or memory components is thus effected during at least two clock periods, it is expedient for the burst length for a burst access to the memory components to be correspondingly doubled or increased further, so that the access data rate is not reduced or is not significantly reduced as a result of the corresponding driving during two or more clock periods. The burst length may be chosen in such a way that the corresponding data are transmitted to the memory components 2 or from the latter during at least two clock periods if the chip activation signal CS is applied during the second clock period directly following the first clock period.

FIG. 3 illustrates a further embodiment of a memory module of the present invention. Identical elements or elements having an identical or similar function are provided with identical reference symbols. In contrast to the embodiment of FIG. 1, different control signals are applied for a first group 21 of the memory components 2 and a second group 22 of the memory components. While the command and address signals CA are supplied via the corresponding signal lines 7 from the buffer component 3 to each of the memory components arranged on the memory module, the signal lines $7_{CS}$ for transmitting the control signals CS are correspondingly shorter since they only supply a portion of the memory components 2 with a respective control signal CS. On account of the high load on the signal lines for the address and command signals CA, disturbances occur which, as described above, greatly influence preferably an input time range of the respective signal eyes, that is to say directly after a signal edge, and decrease the longer the respective signal is applied to the corresponding signal line. Since the load on the signal lines $7_{CS}$ for the control signals CS is considerably lower, such disturbances are not to be expected, or are to be expected only to a small extent, on these signal lines. The memory module 1 of the embodiment of FIG. 3 is generally operated in the same way as the memory module of the embodiment of FIG. 1. The control signal CS is generated in a manner dependent on the items of access information which are applied externally to the memory module 1. However, in one embodiment, depending on the address signal, only one of the two groups 21, 22 of the memory components is addressed at a specific instant.

The buffer component 3 may also be configured in such a way that the operating mode is set in a manner dependent on a configuration value. The configuration value may be stored in a configuration register 12 and determines through its content whether control, command and address signals are applied simultaneously to the corresponding signal lines, or whether, in accordance with the operating mode described above, firstly the command and address signals are applied to the corresponding signal lines and subsequently the control signals are applied to the corresponding signal lines for the group of memory components 2. The configuration value may be fixedly set, on the one hand, or be prescribed by a memory controller during an initialization phase. It may also be possible for the configuration value to be set in a manner dependent on a previously determined load on the signal lines or number of connected memory components on the signal lines and for said value to be forwarded to the memory controller.

FIG. 4 illustrates a memory system having two memory modules 1 and a memory controller 10. The memory controller 10 supplies the items of access information to each of the memory modules 1 and transmits and receives data via the data interfaces 11. If the memory modules 1 are in the operating mode in which the control signal is applied during a second clock period following the application of command and address signals, the memory controller is permitted to transmit to the specific memory module only during every second clock period in accordance with the access information, that is to say that the data rate of the access information must be reduced in accordance with the reduced access speed of the memory modules 1. In this case, however, the two memory modules 1 can receive the access information alternately, so that a first one of the memory modules receives the corresponding access information during one clock period and a second one of the memory modules receives the corresponding access information during a subsequent clock period. In particular, the memory controller 10 should control the respective control units 5 of the respective memory modules 1 in such a way that the command, address and control signals are applied to the respective memory components 2 in such a way that memory data are transmitted in temporally offset fashion to the memory modules 1.

In an alternative embodiment, the two memory modules may be connected to the memory controller not directly but rather in a manner connected to one another by means of a so-called daisy chain. For this purpose, the memory controller is connected to a first one of the memory modules in order to transmit the items of access information and to transmit the corresponding data. The access information contains the address specifying which of the memory modules is to be addressed. A corresponding hub component provided in the first memory module receives the access information and decides whether the control, command and address signals contained in the items of access information are provided for addressing a memory area in the assigned first memory module or whether a subsequent memory module in the daisy chain is to be addressed thereby.

If a subsequent memory module is to be addressed, the items of access information are output via a corresponding output of the hub component of the first memory module and forwarded to a subsequent second memory module, where it is once again ascertained whether the items of access information contain control, command and address signals which are intended to address a corresponding memory area present on the memory module. If the items of access information do not relate to the second memory module, the access information is once again output at an output of the second hub component, etc. That is to say that the items of access information are passed on in such a chain from memory module to memory module. The so-called daisy chain is formed in this way, which is formed from point-to-point connections between the memory controller and the first memory module and between the plurality of memory modules.

While the foregoing is directed to embodiments of the present invention, other and further embodiments of the invention may be devised without departing from the basic scope thereof, and the scope thereof is determined by the claims that follow.

What is claimed is:

1. A buffer component located on a memory module having a plurality of memory components, comprising:
   a first data interface for receiving an item of access information in accordance with a data transmission protocol, wherein the access information includes address, clock, control and command signals;
   a second data interface for driving a clock signal and address and command signals to the plurality of memory components and for driving a control signal to a group of memory components from the plurality of memory components in accordance with a signaling protocol, wherein an activation of the memory components and an acceptance of the address and command signals are effected in a manner dependent on the control signal; and
   a control unit configured to apply the address and command signals to the plurality of memory components during a first clock period of the clock signal and to apply the control signal for activating the group of the plurality of memory components, to the group of the plurality of memory components to be activated when address and command signals are present, in a succeeding second clock period of the clock signal, whereby the address and command signals present are accepted into the respective memory components of the group of the plurality of memory components.

2. The buffer component of claim 1, wherein the control unit is further configured to perform selectively, depending on a configuration value, one of:
   (i) applying the address and command signals to the group of memory components during the first clock period and applying the control signal for activating the group of the plurality of memory components to the group of the plurality of memory components when address and command signals are present, in the succeeding second clock period; and
   (ii) applying the address and command signals to the memory components and the control signal to the group of the plurality of memory components to be activated during the same clock period.

3. The buffer component of claim 1, further comprising:
   a configuration memory for storing the configuration value.

4. The buffer component of claim 1, wherein the control unit is configured to convert the access information into respective address, command and control signals for the memory components in accordance with the signaling protocol.

5. The buffer component of claim 4, wherein the control unit is further configured to generate a plurality of control signals from the items of access information, each of the plurality of control signals being assigned to a corresponding group of the plurality of memory components.

6. The buffer component of claim 1, wherein the control unit is further configured to generate a plurality of control signals from the items of access information, each of the plurality of control signals being assigned to a corresponding group of the plurality of memory components.

7. The buffer component of claim 6, further comprising a plurality of control signal line connections, each line control signal line connection configured to communicate a respective control signal to a respective group of the plurality of memory components.

8. The buffer component of claim 1, wherein the access information is received from a memory controller.

9. A memory module, comprising:
   a plurality of memory components;
   a buffer component comprising:
      a first data interface for receiving an item of access information in accordance with a data transmission protocol, wherein the access information includes address, clock, control and command signals;
      a second data interface for driving a clock signal and address and command signals to the plurality of memory components and for driving a control signal to a group of memory components from the plurality of memory components in accordance with a signaling protocol, wherein an activation of the memory components and an acceptance of the address and command signals are effected in a manner dependent on the control signal; and
      a control unit configured to apply the address and command signals to the plurality of memory components during a first clock period of the clock signal and to apply the control signal for activating the group of the plurality of memory components, to the group of the plurality of memory components to be activated when address and command signals are present, in a succeeding second clock period of the clock signal, whereby the address and command signals present are accepted into the respective memory components of the group of the plurality of memory components;
   a plurality of first signal lines connecting the second data interface to the plurality of memory components, wherein each first signal line is provided for transmitting the clock signal and the command and address signals from the buffer component to each of the memory components; and
   a plurality of second signal lines, each second signal line connecting the second data interface to a respective group of memory components from the plurality of memory components, wherein each second signal line is provided for transmitting the control signal from the buffer component to the memory components in the respective group of memory components.

10. The memory module of claim 9, wherein the control unit of the buffer component is further configured to perform selectively, depending on a configuration value, one of:
    (i) applying the address and command signals to the group of memory components during the first clock period and applying the control signal for activating the group of the plurality of memory components to the group of the plurality of memory components when address and command signals are present in, the succeeding second clock period; and
    (ii) applying the address and command signals to the memory components and the control signal to the group of the plurality of memory components to be activated during the same clock period.

11. The memory module of claim 10, wherein the control unit of the buffer component further comprises a configuration memory for storing the configuration value.

12. The memory module of claim 11, wherein the plurality of memory components are configured to selectively receive and transmit data signals in a burst mode, and wherein a length of a burst in which the data signals are transmitted in accordance with an activation by corresponding control signals, depend on the configuration value provided in the buffer component.

13. The memory module of claim 9, wherein the access information is received from a memory controller.

14. A system, comprising:
   a plurality of memory modules, each memory module comprising:
      a plurality of memory components;
      a buffer component comprising:

a first data interface for receiving an item of access information in accordance with a data transmission protocol, wherein the access information includes address, clock, control and command signals;

a second data interface for driving a clock signal and address and command signals to the plurality of memory components and for driving a control signal to a group of memory components from the plurality of memory components in accordance with a signaling protocol, wherein an activation of the memory components and an acceptance of the address and command signals are effected in a manner dependent on the control signal; and a control unit configured to apply the address and command signals to the plurality of memory components during a first clock period of the clock signal and to apply the control signal for activating the group of the plurality of memory components, to the group of the plurality of memory components to be activated when address and command signals are present, in a succeeding second clock period of the clock signal, whereby the address and command signals present are accepted into the respective memory components of the group of the plurality of memory components;

a plurality of first signal lines connecting the second data interface to the plurality of memory components, wherein each first signal line is provided for transmitting the clock signal and the command and address signals from the buffer component to each of the memory components; and a plurality of second signal lines, each second signal line connecting the second data interface to a respective group of memory components from the plurality of memory components, wherein each second signal line is provided for transmitting the control signal from the buffer component to the memory components in the respective group of memory components; and a memory controller connected to the plurality of memory modules, the memory controller configured to provide items of access information alternately between the plurality of memory modules.

15. The memory system of claim 14, wherein the memory controller is configured to provide the items of access information to each of the memory modules in such a way that the respective control signals generated from the items of access information for the plurality of memory modules are provided from the buffer components of the plurality of memory modules alternately between respective groups of memory components.

16. The memory system of claim 14, wherein the control unit of the buffer component is further configured to perform selectively, depending on a configuration value, one of:
(i) applying the address and command signals to the group of memory components during the first clock period and applying the control signal for activating the group of the plurality of memory components to the group of the plurality of memory components when address and command signals are present in, the succeeding second clock period; and
(ii) applying the address and command signals to the memory components and the control signal to the group of the plurality of memory components to be activated during the same clock period.

17. The memory system of claim 14, wherein the control unit of the buffer component further comprises a configuration memory for storing the configuration value.

18. The memory system of claim 14, wherein the plurality of memory components are configured to selectively receive and transmit data signals in a burst mode, and wherein a length of a burst in which the data signals are transmitted in accordance with an activation by corresponding control signals, depend on the configuration value provided in the buffer component.

19. A method for operating a buffer component located on a memory module having a plurality of memory components, the method comprising:
receiving an item of access information according to a data transmission protocol;
driving, in accordance with a signaling protocol, address, clock and command signals to the plurality of memory components; and
driving, in accordance with the signaling protocol, a control signal to a group of the plurality of memory components;
wherein the address, clock, control and command signals are based on the item of access information;
wherein an activation of the plurality of memory components and an acceptance of the address and command signals are carried out in a manner dependent on the control signal; and
wherein the address and command signals are applied to the memory components during a first clock period of the clock signal and the control signal for activating the group of memory components are applied to the group of the plurality of memory components to be activated when address and command signals are present, in a succeeding second clock period, whereby the address and command signals present are accepted into the group of the plurality of memory components.

20. The method of claim 19, further comprising:
selectively applying the address and command signals and the control signal, depending on a configuration value, as one of:
(i) applying the address and command signals to the group of memory components during the first clock period and applying the control signal for activating the group of the plurality of memory components to the group of the plurality of memory components when address and command signals are present, in the succeeding second clock period; and
(ii) applying the address and command signals to the memory components and the control signal to the group of the plurality of memory components to be activated during the same clock period.

21. The method of claim 19, wherein the access information is converted into respective address, command and control signals for the memory components in accordance with the signaling protocol.

22. The method of claim 21, further comprising:
generating a plurality of control signals from the items of access information, each of the plurality of control signals being assigned to a corresponding group of the plurality of memory components.

23. The method of claim 19, wherein the access information is received from a memory controller.

* * * * *